United States Patent
Yoon et al.

(10) Patent No.: US 7,834,348 B2
(45) Date of Patent: Nov. 16, 2010

(54) DISPLAY DEVICE AND MANUFACTURING METHOD THEREOF

(75) Inventors: Min-Ho Yoon, Seoul (KR); Jung-Han Shin, Yongin-si (KR); Seon-Pil Jang, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 12/388,973

(22) Filed: Feb. 19, 2009

(65) Prior Publication Data

US 2009/0224248 A1    Sep. 10, 2009

(30) Foreign Application Priority Data

Mar. 4, 2008    (KR) .................. 10-2008-0020089

(51) Int. Cl.
*H01L 35/24* (2006.01)
(52) U.S. Cl. .................. 257/40; 257/59; 257/E21.535; 257/E27.111; 257/72
(58) Field of Classification Search ........................ None
See application file for complete search history.

(56) References Cited

U.S. PATENT DOCUMENTS 6,091,466 A * 7/2000 Kim et al. .................. 349/43

2002/0187573 A1 * 12/2002 Kido ..................... 438/30
2006/0138405 A1    6/2006 Yang

FOREIGN PATENT DOCUMENTS

| JP | 08-139336 | 5/1996 |
|---|---|---|
| JP | 2007-036006 | 2/2007 |
| JP | 2007-067390 | 3/2007 |
| JP | 2007-234974 | 9/2007 |
| KR | 10-0544144 | 1/2005 |
| KR | 10-0647690 | 11/2006 |
| KR | 10-0683760 | 2/2007 |
| KR | 10-0730177 | 6/2007 |
| KR | 10-0751382 | 8/2007 |

* cited by examiner

*Primary Examiner*—W. David Coleman
*Assistant Examiner*—Shaka Scarlett
(74) *Attorney, Agent, or Firm*—H.C. Park & Associates, PLC

(57) ABSTRACT

The present invention provides a display device and a manufacturing method thereof. The display device includes a gate line, a data line that is insulated from and crosses the gate line, a thin film transistor including a semiconductor layer and connected to the gate line and the data line, a pixel electrode connected to the thin film transistor, and a dummy drain electrode adjacent to a channel region of the thin film transistor. The dummy drain electrode is not connected to the pixel electrode.

21 Claims, 8 Drawing Sheets

DISPLAY DEVICE AND MANUFACTURING METHOD THEREOF

CROSS-REFERENCE TO RELATED APPLICATION

This application claims priority from and the benefit of Korean Patent Application No. 10-2008-0020089, filed on Mar. 4, 2008, which is hereby incorporated by reference for all purposes as if fully set forth herein.

BACKGROUND OF THE INVENTION

1. Field of the Invention

The present invention relates to a display device and a manufacturing method thereof.

2. Discussion of the Background

Recently, flat panel displays that are small and light weight have attracted attention. Examples of a flat panel display include a liquid crystal display (LCD), an organic light emitting display (OLED), and an electrophoretic display device. A flat panel display may include a thin film transistor substrate having a thin film transistor. The thin film transistor may be connected to a pixel electrode.

The thin film transistor includes a drain electrode and a source electrode with a channel region therebetween. The drain electrode is connected to the pixel electrode and drives the pixel electrode by charge transfer in the channel region. In order to improve the display quality, a current should not flow when the thin film transistor is turned off. However, the charge transfer outside the channel region may cause a leakage current, which may deteriorate the off-characteristics of the thin film transistor.

Particularly, the leakage current may become a problem in a thin film transistor that uses an organic semiconductor. The organic semiconductor may be formed by an inkjet method that does not require additional patterning and, if the organic semiconductor layer is disposed over a wide area outside the channel region rather than limited to the channel region, a current leakage may be generated.

Meanwhile, in order to limit the organic semiconductor layer to be formed within a certain region, a barrier rib may be used. However, since the barrier rib is separately formed, the process may be complicated. In addition, even if the barrier rib is formed, it may be difficult to limit the formation the organic semiconductor layer to the channel region, thus still resulting in a current leakage.

SUMMARY OF THE INVENTION

The present invention provides a display device that may have improved display quality.

The present invention also provides a method of manufacturing the display device.

Additional features of the invention will be set forth in the description which follow, and in part will be apparent from the description, or may be learned by practice of the invention.

The present invention discloses a display device including a gate line, a data line insulated from and crossing the gate line, a thin film transistor, which includes a semiconductor layer, connected to the gate line and the data line, a pixel electrode connected to the thin film transistor, and a dummy drain electrode adjacent to a channel region of the thin film transistor. The dummy drain electrode is not connected to the pixel electrode.

The present invention also discloses a method of manufacturing a display device including a plurality of pixels. The method includes forming a source electrode and a drain electrode facing each other with a channel region therebetween, forming a dummy drain electrode adjacent to the channel region, and forming a pixel electrode that is connected to the drain electrode and not connected to the dummy drain electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE EMBODIMENTS

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements and layers may be present. In contrast, when an element is referred to as being "directly on" or "directly connected to" another element or layer, there are no intervening element or layers present.

In the following exemplary embodiments of the present invention, a description will be given with respect to a liquid crystal display as the display device. However, the present invention is not limited thereto, and is also applicable to other display devices such as an organic light emitting display (OLED) and an electrophoretic display device.

Figure 1:
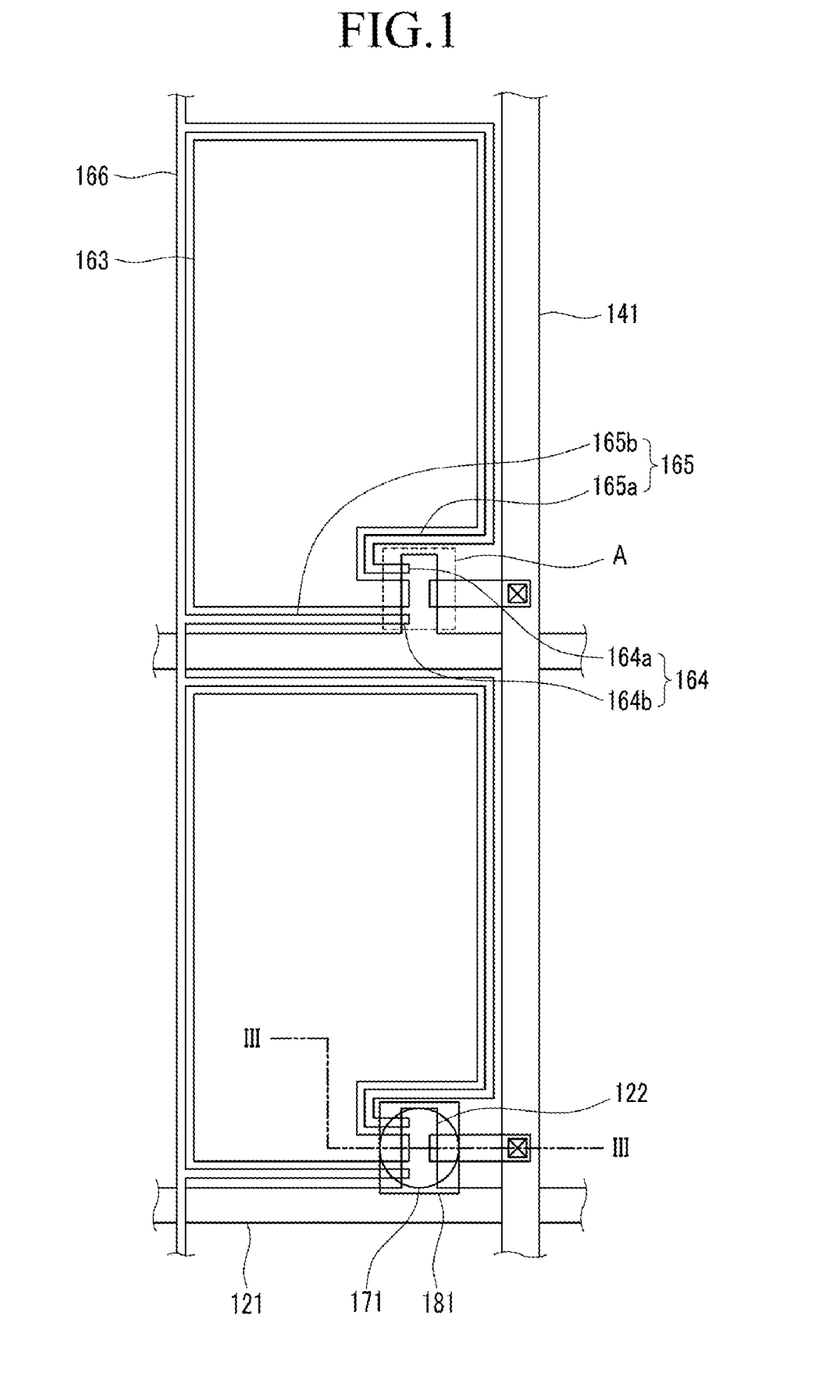
FIG. 1 is a layout view of a display device in accordance with a first exemplary embodiment of the present invention.

A display device according to a first exemplary embodiment of the present invention will be described with reference to FIG. 1, FIG. 2, and FIG. 3.

Figure 3:
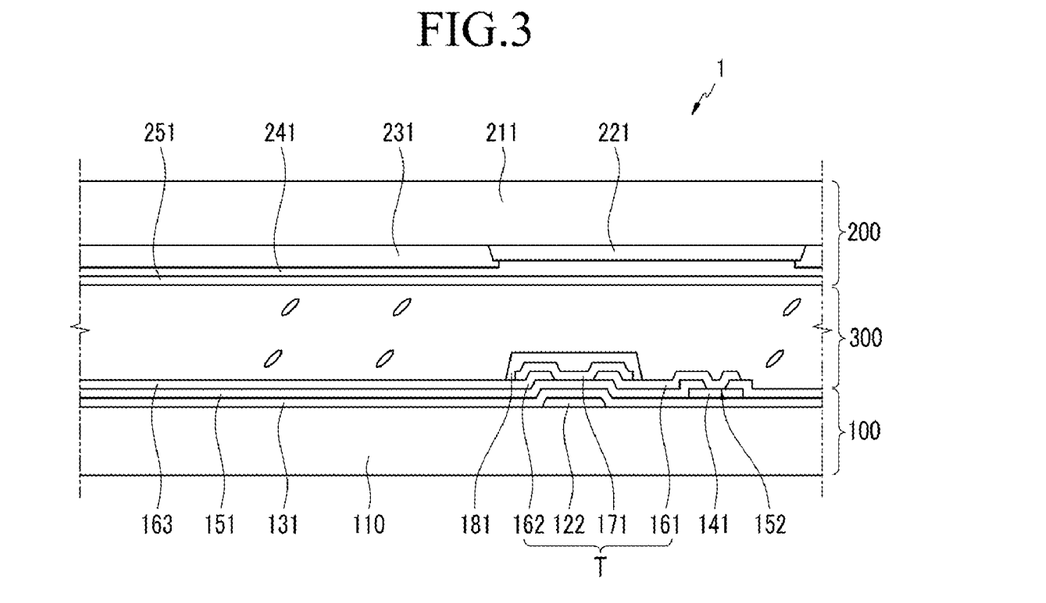
FIG. 3 is a cross-sectional view taken along line III-III of FIG. 1.

First, referring to FIG. 3, the display device 1 includes a first substrate 100 having a thin film transistor T, a second substrate 200, and a liquid crystal layer 300. The liquid crystal layer 300 is disposed between the first substrate 100 and the second substrate 200.

First, the first substrate 100 will be described below.

The first insulation substrate 110 may be made of glass or plastic. When the first insulation substrate 110 is made of plastic it may provide the display device 1 with flexibility. Since the formation of an organic semiconductor layer 171, which will be described below, may be performed at room temperature and atmospheric pressure, an insulation substrate made of plastic material may be used.

As the plastic material, polycarbon, polyimide, polyethersulfone (PES), polyarylate (PAR), polyethylene naphthalate (PEN), or polyethylene terephthalate (PET) may be suitable.

A gate wiring 121 and 122 is disposed on the first insulation substrate 110. The gate wiring 121 and 122 may be made of a single metal layer or multiple metal layers and may include a gate line 121 extending in a horizontal direction and a gate electrode 122 extending from the gate line 121.

In the first exemplary embodiment, a storage capacitor is omitted, but the gate wiring 121 and 122 may further include a storage line arranged parallel to the gate line 121 to form a storage capacitor together with a pixel electrode 163.

A first insulating layer 131 is provided on the gate wiring 121 and 122. The first insulating layer 131 may be made of an inorganic material, such as silicon nitride or silicon oxide. The first insulating layer 131 connects the gate wiring 121 and 122 to a data line 141.

The data line 141 is disposed on the first insulating layer 131. The data line 141 may be made of a single metal layer or multiple metal layers and extends in the vertical direction.

A second insulating layer 151 is disposed on the data line 141. The second insulating layer 151 may be made of an inorganic material, such as silicon nitride or silicon oxide. A contact hole 152 that exposes a portion of the data line 141 is formed in the second insulating layer 151.

The first insulating layer 131 and the second insulating layer 151 are used during the formation of the gate line 121 and 122 and the data line 141 to prevent the organic semiconductor layer 171, which may have poor chemical resistance and plasma resistance, from being damaged by residual chemical material or plasma.

A transparent conductive layer 161, 162, 163, 164, 165, and 166 is disposed on the second insulating layer 151. The transparent conductive layer 161, 162, 163, 164, 165, and 166 may be made of a transparent conductive material, such as indium tin oxide (ITO) or indium zinc oxide (IZO). The transparent conductive layer 161, 162, 163, 164, 165, and 166 includes a source electrode 161 connected to the data line 141 through the contact hole 152, a drain electrode 162 facing the source electrode 161 with the channel region interposed therebetween, a pixel electrode 163 formed integrally with the drain electrode 162, a dummy drain electrode 164 formed adjacent to the channel region, and a connection line 165 and 166 connecting the dummy drain electrode 164 and applying a voltage to the dummy drain electrode 164.

In the first exemplary embodiment, the channel region where the source electrode 161 and the drain electrode 162 face each other is formed in the shape of an "I".

The dummy drain electrode 164 is adjacent to the channel region and close to the drain electrode 162. The dummy drain electrode 164 may include a first dummy drain electrode 164a positioned at the top of the channel region and a second dummy drain electrode 164b positioned at the bottom of the channel region.

A portion of the dummy drain electrode 164 overlaps the gate electrode 122 and the organic semiconductor layer 171. Accordingly, it may be possible to prevent current flow between the dummy drain electrode 164 and the source electrode 161, even though this area is outside of the channel region.

The dummy drain electrode 164 is not connected to the pixel electrode 163, and the first dummy electrode 164a and the second dummy electrode 164b are connected to each other through the connection line 165 and 166.

The main connection line 166 extends parallel to the data line 141. Although not shown, a common voltage is applied to a terminal of the main connection line 166. Accordingly, the common voltage is applied to the dummy drain electrode 164. However, in other exemplary embodiments, a voltage other than the common voltage may be applied to the dummy drain electrode 164, and a ground voltage may also be applied thereto.

A sub-connection line 165 includes a first sub-connection line 165a connecting the first dummy drain electrode 164a to the main connection line 166, and a second sub-connection line 165b connecting the second dummy drain electrode 164b to the main connection line 166. The first sub-connection line 165a is bent four times, and the second sub-connection line 165b is linear and extends parallel to the gate line 121.

The above-described dummy drain electrode 164, sub-connection line 165, and main connection line 166 may be integrally formed.

The organic semiconductor layer 171 is disposed on the source electrode 161, the drain electrode 162, and the second insulating layer 151 exposed in the channel region. The organic semiconductor layer 171 is also disposed between the source electrode 161 and the dummy drain electrode 164 in addition to in the channel region. Accordingly, the organic semiconductor layer 171 is in contact with the source electrode 161, the drain electrode 162, and the dummy drain electrode 164.

The organic semiconductor layer 171 may be made by a solution process such as an inkjet method, and a polymer organic semiconductor material or a low-molecular organic semiconductor material, dissolved in an aqueous solution or an organic solvent, may be used. Since the polymer organic semiconductor material may be dissolved in a solvent, it may be suitable for the inkjet process. However, any low-molecular organic semiconductor material that is well dissolved in an organic solvent may also be used.

Meanwhile, the organic semiconductor layer 171 may include a derivative containing a tetracene or pentacene substituent, or 4 to 8 oligothiophene coupled to one another 4 to 8 oligothiophene through 2 and 5 positions of thiophene rings.

The organic semiconductor layer 171 may include perylenetetracarboxylic dianhydride (PTCDA) or an imide derivative thereof, or naphthalenetetracarboxylic dianhydride (NTCDA) or an imide derivative thereof.

The organic semiconductor layer 171 may include metallized phthalocyanine or a halogenized derivative thereof, or perylene or coroene and a derivative containing a substituent thereof Copper, cobalt, and zinc may be added to the metallized phthalocyanine.

The organic semiconductor layer 171 may include a co-oligomer or co-polymer of thienylene and vinylene.

The organic semiconductor layer 171 may include thienylene or coroene and a derivative containing a substituent thereof, or a derivative containing at least one hydrocarbon chain having 1 to 30 carbon atoms in an aromatic or heteroaromatic ring of the derivatives.

A third insulating layer 181 is provided on top of the organic semiconductor layer 171.

The third insulating layer 181 may prevent deterioration of the organic semiconductor layer 171 and maintain the characteristics of the organic semiconductor layer 171. The third insulating layer 181 may be made by an exposure and development process or an inkjet process.

In the first exemplary embodiment, a barrier rib is not used for the formation of the organic semiconductor layer 171. Accordingly, the side of the organic semiconductor layer 171, i.e., the edge of the organic semiconductor layer 171, is in contact with the third insulating layer 181.

Next, the second substrate 200 will be described below.

A second insulation substrate 211 may include a plastic substrate like the first insulation substrate 111. When both insulation substrates 111 and 211 are made of plastic, the display device 1 may become more flexible.

A light blocking member 221 provided on the second insulation substrate 211 blocks light from being transmitted to the thin film transistor T of the first substrate 100. The light blocking member 221 may be made of a black photosensitive material.

A color filter 231 is disposed on either side of the light blocking member 221. The color filter 231 may include red, green, and blue sublayers. The color filter 231 may include a photosensitive material containing pigment and be made by an exposure and development process.

An overcoat layer 241 is disposed on the color filter 231. The overcoat layer 241 provides a flat surface and may be omitted.

A common electrode 251 is disposed on the overcoat layer 241. The common electrode 251 may be made of a transparent conductive material, such as ITO or IZO, and receives a common voltage.

An alignment of liquid crystal molecules of the liquid crystal layer 300 changes according to an electric field generated between the pixel electrode 163 and the common electrode 251, thus controlling light transmittance.

The effects of the dummy drain electrode 164 in the above-described display device 1 will be described with reference to FIG. 2 and FIG. 4.

Figure 2:
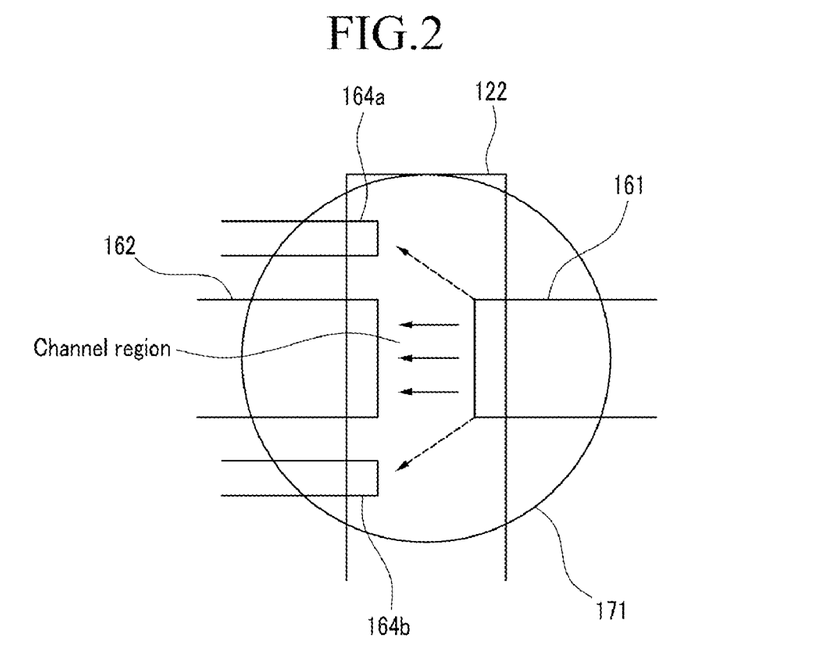
FIG. 2 is an enlarged view of portion A of FIG. 1.

Referring to FIG. 2, the organic semiconductor layer 171 covers the dummy drain electrode 164. Accordingly, the charge transfer occurs in a non-channel region (as shown by the dotted arrows) as well as in the channel region (as shown by the solid arrows). When the charge transfer occurring in the non-channel region affects the drain electrode 162, the off-characteristics of the thin film transistor T may be deteriorated, and thus a leakage current occurs.

According to the first exemplary embodiment, the charge in the non-channel region is transferred to the dummy drain electrode 164 along the connection line 165 and 166 and, as a result, it does not affect the pixel electrode 163. Accordingly, the charge transfer in the non-channel region may not affect the off-characteristics of the thin film transistor T.

Figure 4:
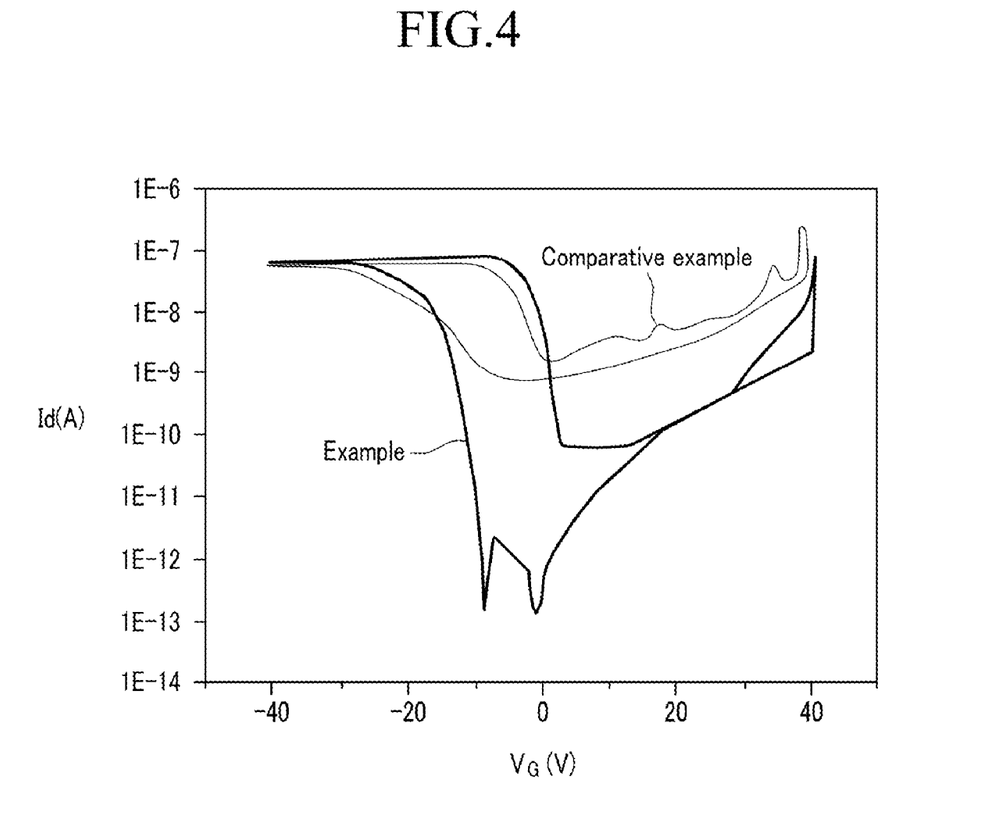
FIG. 4 shows a method of manufacturing the display device according to the first exemplary embodiment of the present invention.

Referring to FIG. 4, it may be ascertained that the current value of the example, in which the dummy drain electrode 164 is used, is smaller than that of the comparative example, in which no dummy drain electrode 164 is used, in the off voltage region of 0 V to 10 V. That is, the leakage current of the thin film transistor T may be reduced by the dummy drain electrode 164, and thus the off-characteristics of the thin film transistor T may be improved.

In the first exemplary embodiment, the organic semiconductor layer 171 is disposed over a wide area, and the reason for this will be described with reference to FIG. 5, which shows a method of manufacturing the display device 1.

Figure 5:
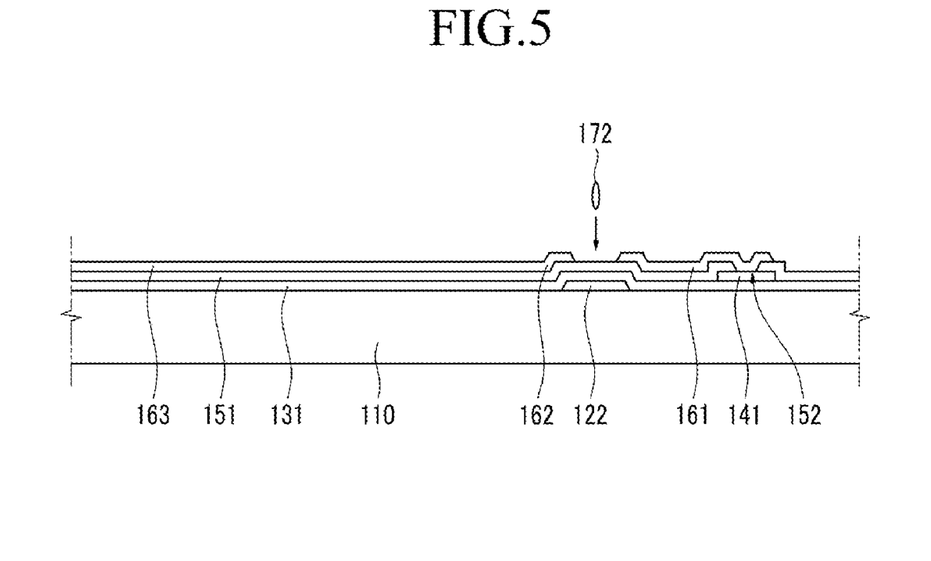
FIG. 5 shows characteristics of a thin film transistor in the display device according to the first exemplary embodiment of the present invention.

FIG. 5 shows only the formation process of the organic semiconductor layer 171 and, since the other processes are performed in the ordinary manner, their description is omitted. However, the transparent conductive layer 161, 162, 163, 164, 165, and 166 may be formed depositing an ITO layer on the second insulating layer 151 and then subjecting the ITO layer to a photolithography process.

Referring to FIG. 5, organic semiconductor ink 172 is jetted onto the transparent conductive layer 161, 162, 163, 164, 165, and 166. The organic semiconductor ink 172 includes an organic semiconductor material and a solvent. When the organic semiconductor layer 171 is formed by a solution process, such as ink-jetting, a vacuum or high temperature process is not required, which may reduce the manufacturing cost. Moreover, a plastic substrate vulnerable to the high temperature process may be used.

The first exemplary embodiment does not use a barrier rib to define the formation position of the organic semiconductor layer 171. Accordingly, the jetted organic semiconductor ink 172 is applied over a wide area including the periphery of the channel region as well as the channel region.

The first exemplary embodiment without a barrier rib may simplify the manufacturing of the display device 1. On the other hand, having no barrier rib renders an organic semiconductor layer 171 formed over a wide area, which may cause the charge to flow in the non-channel region. However, the dummy drain electrode 164 may solve such a problem.

Since the dummy drain electrode 164 and the connection line 165 and 166, which reduce the problem caused by the charge flow in the non-channel region, are formed simultaneously with the source electrode 161 and the drain electrode 162, no additional process is required.

Although the drain electrode 162 and the pixel electrode 163 are integrally formed in the first exemplary embodiment, the drain electrode 162 and the pixel electrode 163 may be disposed on separate layers in another exemplary embodiment.

A display device in accordance with a second exemplary embodiment of the present invention will be described with reference to FIG. 6 and FIG. 7 below.

In the second exemplary embodiment, a barrier rib 191 is used in the formation of an organic semiconductor layer 171. Since the organic semiconductor layer 171 is formed by an inkjet method after the formation of the barrier rib 191, it may be possible to confine the formation position thereof. In the second exemplary embodiment, the side of the organic semiconductor layer 171, i.e., the edge of the organic semiconductor layer 171, is in contact with the barrier rib 191.

The barrier rib 191 serves as a frame to form the organic semiconductor layer 171. When the organic semiconductor ink is dropped to form the organic semiconductor layer 171, if the drop size of the semiconductor ink is large, if the ink is not dropped in an accurate position, or if the drop sizes are different from one another, the organic semiconductor ink may be unevenly distributed. Accordingly, the barrier rib 191 may be provided to prevent the organic semiconductor layer 171 from not being uniformly formed due to the uneven distribution of the organic semiconductor ink. That is, the position at which the ink is dropped is specified in the inkjet method so that the inkjet process may be accurately performed.

The barrier rib 191 may be made of a fluorine-based polymer. The barrier rib 191 may be hydrophobic if the ink dropped onto the barrier rib 191 is hydrophilic, and the barrier rib 191 may be hydrophilic if the ink dropped onto the barrier rib 191 is hydrophobic. The fluorine-based polymer may be both water repellant and oil repellant. The fluorine-based polymer may include, but is not limited to, polytetrafluoroethylene (PTFE), fluorinated ethylene propylene (FEP), polyfluoroalkoxy (PFA), ethylenetetrafluoroethylene (ETFE), or polyvinylidene fluoride (PVDF).

Figure 6:
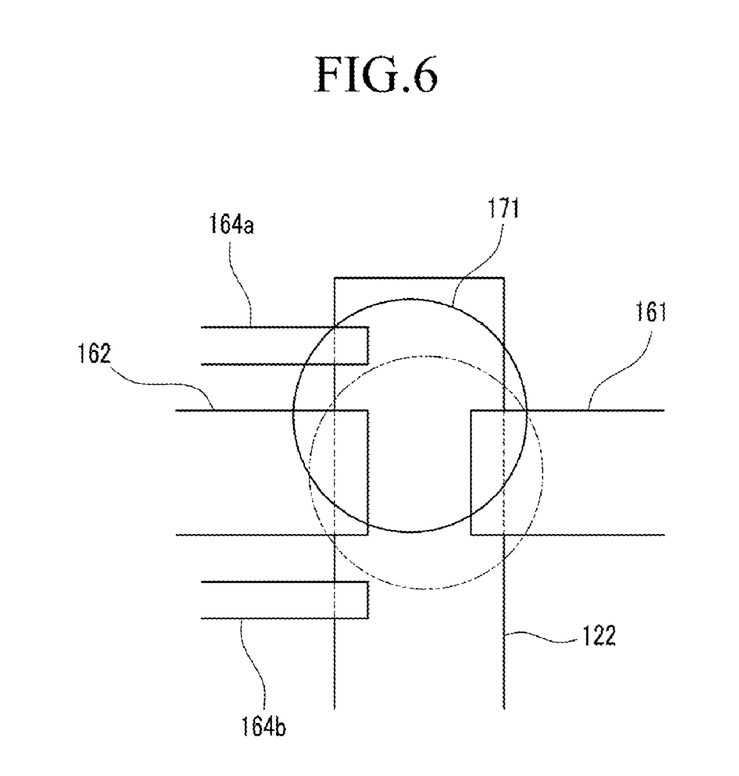
FIG. 6 is a layout view of a display device according to a second exemplary embodiment of the present invention.
Figure 7:
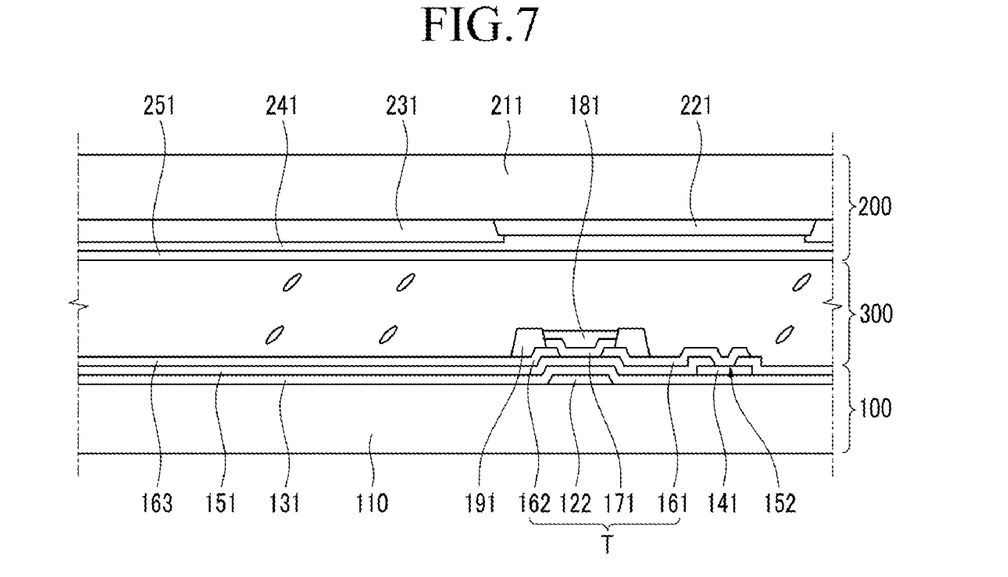
FIG. 7 is a cross-sectional view of the display device according to the second exemplary embodiment of the present invention.

However, as shown in FIG. 6, the semiconductor layer 171 may be positioned in the peripheral region due to an error in the process, and not be limited to the channel region. The circle indicated by the dotted line in FIG. 6 is a position where the organic semiconductor layer 171 is formed in accordance with design specifications.

At this time, the charge flow occurring in the non-channel region is moved to the dummy drain electrode 164, and thus deterioration of the off-characteristics of the thin film transistor T may be prevented.

Even though the barrier rib 191 is used as described above, it may not be easy to confine the position of the organic semiconductor layer 171 to the channel region. Accordingly, if the dummy drain electrode 164 is used when the barrier rib 191 is used, it may be possible to further reduce the leakage current of the thin film transistor T.

Figure 8:
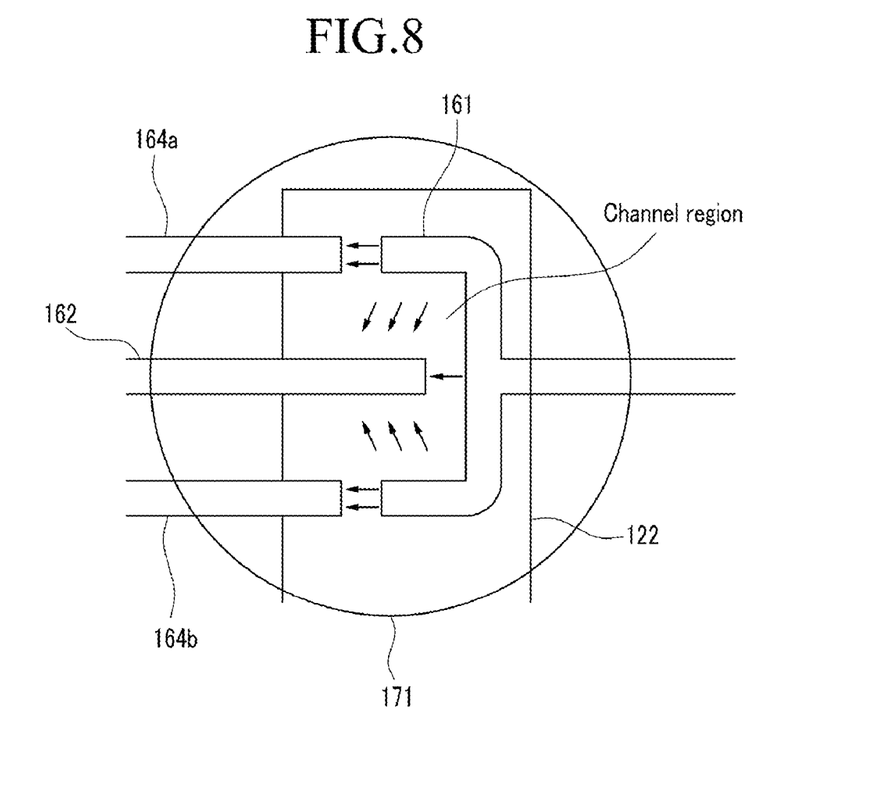
FIG. 8 is a layout view of a display device according to a third exemplary embodiment of the present invention.

Referring to FIG. 8, a display device in accordance with a third exemplary embodiment will be described.

While the channel region is formed in the shape of an "I" chaacter in the first exemplary embodiment, a channel region in accordance with the third exemplary embodiment is formed in the shape of a "U". Also, in the third exemplary embodiment, undesired charge flow in the non-channel region (as shown by the dotted arrows) may not affect the drain electrode 162 due to the dummy drain electrode 164.

Exemplary embodiments of the present invention may include a channel region having shapes other than an "I" or a "U". Moreover, exemplary embodiments of the present invention may include a top-gate type thin film transistor in which a semiconductor layer is disposed between an insulation substrate and a gate electrode.

Figure 9:
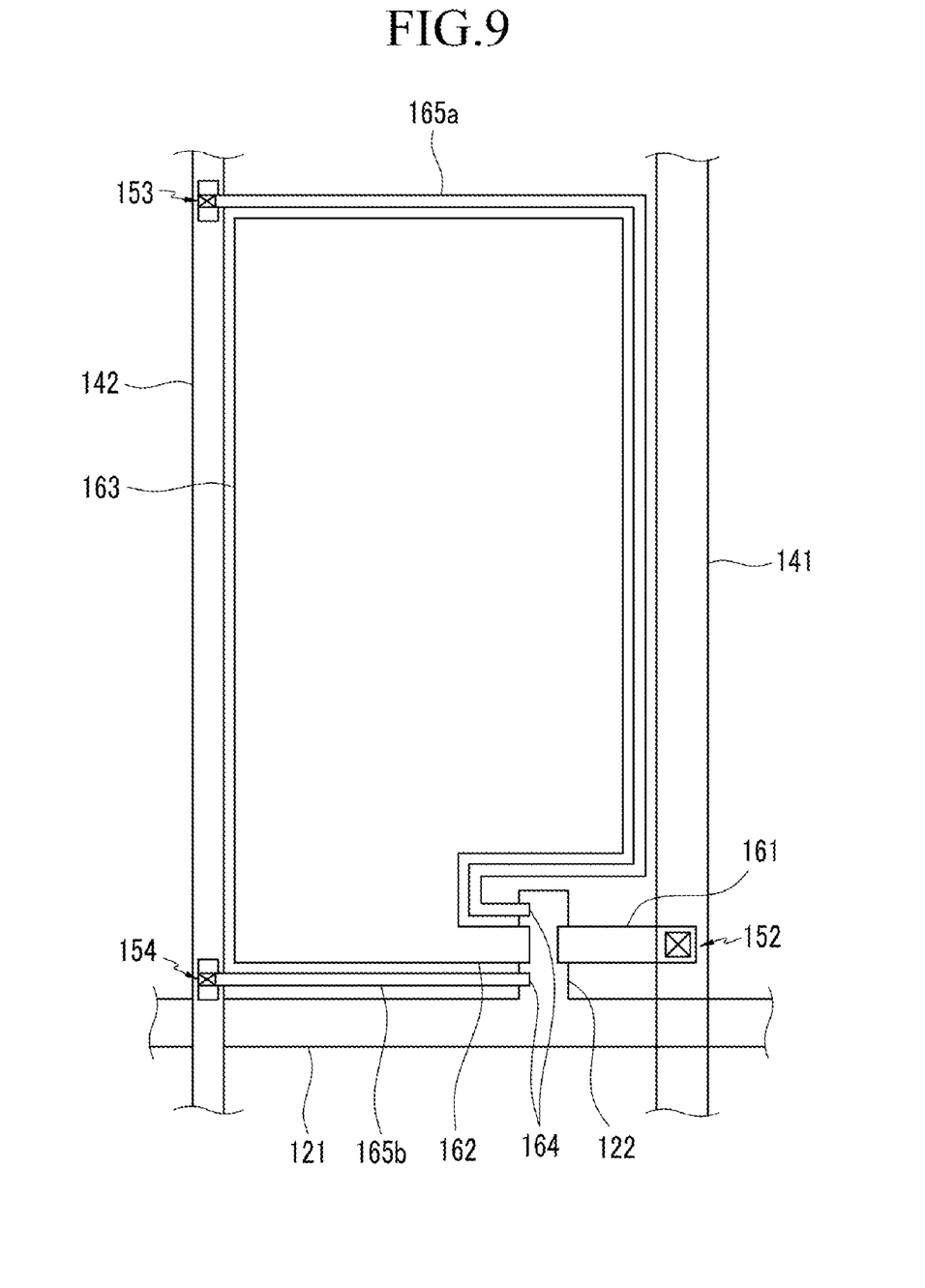
FIG. 9 is a layout view of a display device according to a fourth exemplary embodiment of the present invention.

Referring to FIG. 9, a fourth exemplary embodiment will be described.

In the fourth exemplary embodiment, a portion of a connection line 142 and 165 is formed on the same layer as a data line 141. That is, a main connection line 142 is formed on the same layer as the data line 141.

Since the main connection line 142 is very long, forming a high resistance, it may be difficult to supply a desired voltage to the dummy drain electrode 164. The fourth exemplary embodiment, which has the main connection line 142, is formed on the same metal layer as the data line 141, may reduce the resistance, and thus may smoothly apply a common voltage to the dummy drain electrode 164.

A first sub-connection line 165a is connected to the main connection line 142 through a contact hole 153 formed in a second insulating layer 151, and a second sub-connection line 165b is connected to the main connection line 142 through a contact hole 154 formed in the second insulating layer 151.

In other exemplary embodiments, the same layer as the gate line 121 may be a portion of the connection line.

Figure 10:
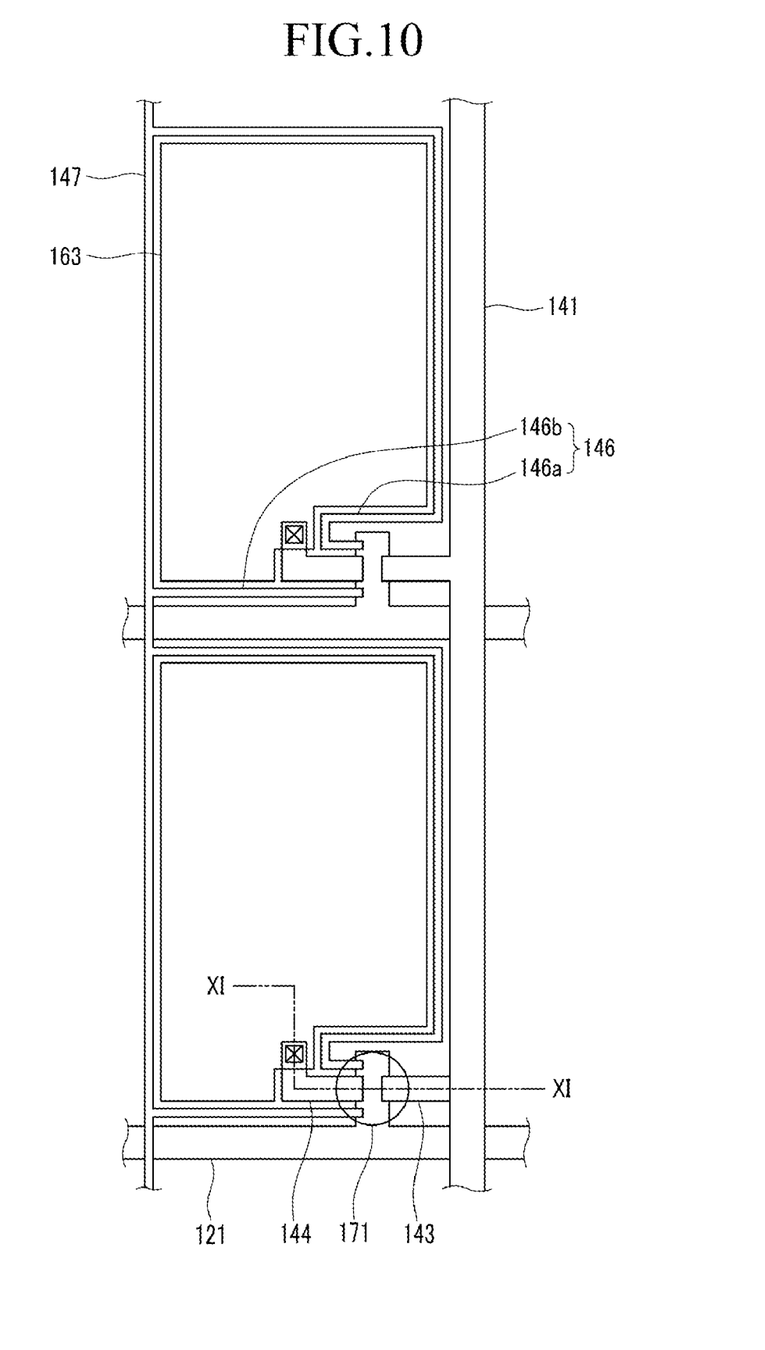
FIG. 10 is a layout view of a display device according to a fifth exemplary embodiment of the present invention.
Figure 11:
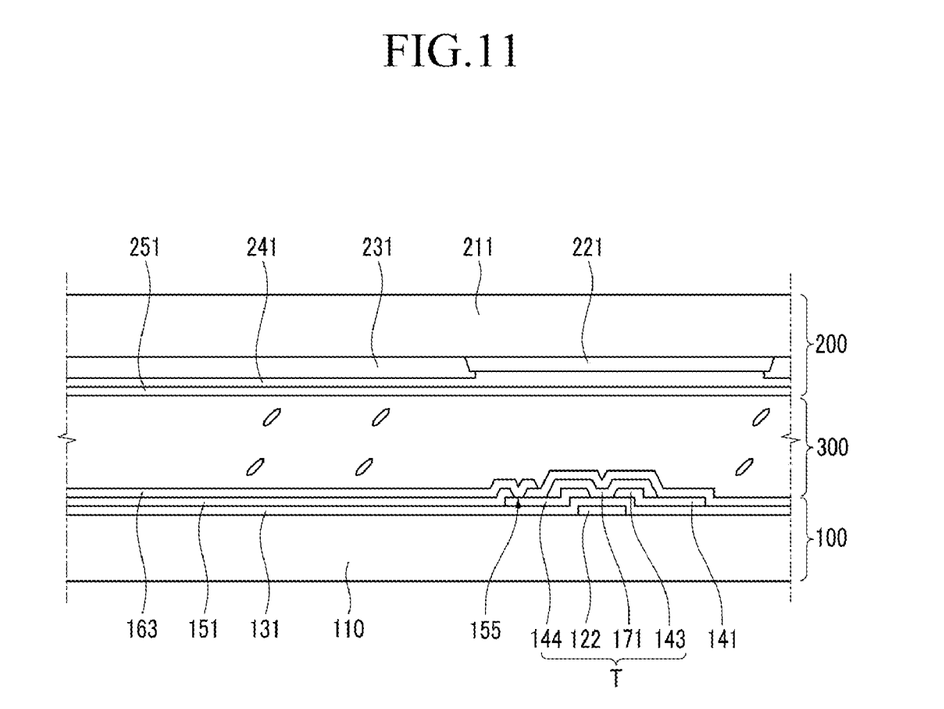
FIG. 11 is a cross-sectional view taken along line XI-XI of FIG. 10.

Referring to FIG. 10 and FIG. 11, a fifth exemplary embodiment will be described.

In the fifth exemplary embodiment, a data line 141, a source electrode 143, a drain electrode 144, a dummy drain electrode 145, and a connection line 146 and 147 are provided on the same layer. A pixel electrode 163 is connected to the drain electrode 144 through a contact hole 155 formed in a second insulating layer 151. A semiconductor layer 171 is covered by the second insulating layer 151.

According to the fifth exemplary embodiment, since the dummy drain electrode 145 and the connection line 146 and 147 are formed on the same metal layer as the data line 141, the resistance may be reduced, and thus a common voltage may be smoothly applied to the dummy drain electrode 145.

Although the above described exemplary embodiment only shows an organic semiconductor layer, exemplary embodiments of the present invention may include a semiconductor formed of an inorganic semiconductor, such as silicon. When an inorganic semiconductor is used, since the semiconductor layer is formed by photolithography, it may be easy to define the formation position thereof, however, it may be difficult to confine the position of the semiconductor layer to the channel region due to an error in the process. Therefore, exemplary embodiments of the present invention may be useful.

Although a pair of dummy drain electrodes 164 is provided on the top and bottom of the channel region in the above exemplary embodiments, the present invention is not limited thereto. In another exemplary embodiment, a plurality of dummy drain electrodes 164 may be provided at either the top or the bottom of the channel region. Moreover, in still another exemplary embodiment, the dummy drain electrode 164 may be provided on one side of the channel region and, in this case, the region of the pixel electrode 163 may extend to increase the aperture ratio.

Furthermore, according to exemplary embodiments of the present invention, a display device, in which a leakage current of a thin film transistor may be reduced, and a manufacturing method thereof are provided.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A display device, comprising:
   a gate line;
   a data line insulated from and crossing the gate line;
   a thin film transistor comprising a semiconductor layer, the thin film transistor connected to the gate line and the data line;
   a pixel electrode connected to the thin film transistor; and
   a dummy drain electrode adjacent to a channel region of the thin film transistor, the dummy drain electrode not being connected to the pixel electrode.

2. The display device of claim 1, wherein the semiconductor layer comprises an organic semiconductor.

3. The display device of claim 1, wherein at least a portion of the dummy drain electrode overlaps the semiconductor layer.

4. The display device of claim 1, wherein the thin film transistor comprises a source electrode and a drain electrode facing each other with the channel region therebetween,
   wherein the source electrode is connected to the data line, and the drain electrode is connected to the pixel electrode, and wherein the dummy drain electrode is closer to the drain electrode than to the source electrode.

5. The display device of claim 1, wherein the thin film transistor comprises a source electrode and a drain electrode facing each other with the channel region therebetween,
    wherein the source electrode is connected to the data line, and the drain electrode is connected to the pixel electrode, and
    wherein the source electrode, the drain electrode, and the dummy drain electrode are on the same layer.

6. The display device of claim 5, wherein the source electrode, the drain electrode, and the dummy drain electrode are on the same layer as the data line.

7. The display device of claim 5, wherein the drain electrode and the pixel electrode are integrally formed.

8. The display device of claim 5, wherein the source electrode, the drain electrode, and the dummy drain electrode all comprise a transparent conductive material.

9. The display device of claim 1, further comprising a connection line comprising a main connection line parallel to one of the gate line and the data line,
    wherein the dummy drain electrode is connected to the connection line.

10. The display device of claim 9, wherein at least a portion of the main connection line comprises a metal layer.

11. The display device of claim 10, wherein the metal layer is on the same layer as one of the gate line and the data line.

12. The display device of claim 11, wherein the connection line, the dummy drain electrode, and the data line are on the same layer.

13. The display device of claim 9, wherein the connection line surrounds the pixel electrode.

14. The display device of claim 1, further comprising an insulating layer covering the semiconductor layer,
    wherein a side of the semiconductor layer contacts the insulating layer.

15. The display device of claim 1, further comprising a barrier rib surrounding the semiconductor layer.

16. The display device of claim 1, wherein the channel region has the shape of an "I" or the shape of a "U".

17. The display device of claim 1, wherein a voltage is applied to the dummy drain electrode.

18. The display device of claim 17, further comprising a common electrode to receive a common voltage, and
    wherein the common voltage is applied to the dummy drain electrode.

19. A method for manufacturing a display device including a plurality of pixels, comprising:
    forming a source electrode and a drain electrode facing each other with a channel region therebetween;
    forming a dummy drain electrode adjacent to the channel region; and
    forming a pixel electrode that is connected to the drain electrode and not connected to the dummy drain electrode.

20. The method of claim 19, further comprising forming a connection line that is connected to the dummy drain electrode and provided in a plurality of pixels.

21. The method of claim 20, wherein the source electrode, the drain electrode, the dummy drain electrode, and the connection line are on the same layer.

* * * * *